US 6,702,607 B2

(12) United States Patent
Kondo

(10) Patent No.: US 6,702,607 B2
(45) Date of Patent: Mar. 9, 2004

(54) WIRING HARNESS AND MANUFACTURING METHOD OF THE SAME

(75) Inventor: Masayuki Kondo, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/838,121

(22) Filed: Apr. 20, 2001

(65) Prior Publication Data
US 2002/0028600 A1 Mar. 7, 2002

(30) Foreign Application Priority Data
May 10, 2000 (JP) ........................................ 2000-137612

(51) Int. Cl.[7] ................................................. H01R 9/07
(52) U.S. Cl. ........................................ 439/498; 174/72 A
(58) Field of Search ............................... 439/502, 498; 174/72 A, 139, 149 B, 154; 361/826, 827

(56) References Cited

U.S. PATENT DOCUMENTS

| 4,065,199 A | * | 12/1977 | Andre et al. ................. 439/498 |
| 4,898,544 A | * | 2/1990 | Callahan ...................... 439/498 |
| 5,130,499 A | * | 7/1992 | Dijkshoorn .................. 174/254 |
| 5,610,447 A | * | 3/1997 | Nishikawa et al. ......... 174/72 A |

FOREIGN PATENT DOCUMENTS

| DK | 197 34 505 A1 | 8/1997 | |
| EP | 0 795 931 A1 | 9/1997 | |
| EP | 10-217875 | 8/1998 | |
| GB | 2 275 373 | * 8/1994 | ............... 174/72 A |
| JP | 1-306340 | 12/1989 | |
| JP | 5-131882 | 5/1993 | |
| JP | 5-54104 | 7/1993 | |
| JP | 6-67181 | 9/1994 | |
| WO | WO 99/44863 | 9/1999 | |
| WO | WO 99/52743 | 10/1999 | |

OTHER PUBLICATIONS

Copy of European Search Report.

* cited by examiner

Primary Examiner—Tulsidas Patel
Assistant Examiner—Phuong K T Dinh
(74) Attorney, Agent, or Firm—Armstrong, Kratz, Quintos, Hanson & Brooks, LLP

(57) ABSTRACT

A wiring harness suitable for disposition in the roof of a motor vehicle comprising one or more standardized circuit units is disclosed. The circuit units incorporate a connector at at least one end or at at least one intermediate portion for collectively arranging electrical cables therein. The circuit unit is flexible, disposed in a flat shape, and capable of being provided with a fold for redirection.

2 Claims, 4 Drawing Sheets

WIRING HARNESS AND MANUFACTURING METHOD OF THE SAME

BACKGROUND OF THE INVENTION

1. Field of the Invention

The present invention relates to a wiring harness and a manufacturing method of the same, particularly to a wiring harness disposed on a roof structure of a motor vehicle. The wiring harness includes a flexible flat circuit unit, a flexible printed circuit unit, a flat conductor circuit unit, or a ribbon-shaped circuit unit having round electrical wires.

2. Related Art

Many types of wiring harnesses having different length cables and used for different applications are prepared as inventories. The wiring harnesses are bundled with one another by using an adhesive tape for a motor vehicle to correspond with the type and grade of the vehicle. For an inventory management of the wiring harnesses, identification numbers are provided to the wiring harnesses. However, the inventory management of the wiring harnesses requires complicated work.

One of such wiring harnesses is illustrated in FIG. 8. The wiring harness is a specified grade one for a specified type vehicle. The wiring harness has a branch line for a dome lamp 1, a branch line for a vanity mirror lamp 2L arranged in a left side of the vehicle in the head direction thereof, a cable line for a vanity mirror lamp 2R arranged in a right side of the vehicle, a cable line for a rear room lamp 3R, a left-side branch line for another rear room lamp 3L, a branch line for a switch 4A of a sun roof, and a branch line for an electric control unit 4B of the sun roof.

As illustrated in the drawing, these electrical cables are generally roughly bundled by using tapes 5 at a lot of positions of the harness. The tapes 5 bundle some of electrical cables different in purposes at distributed points. The bundled electrical cables are secured, or example, by clamps 6 during assembling thereof and are incorporated into a wiring harness. The electrical cables each have one end which is received in a connector 7.

For example, when a normal-grade motor vehicle requires no sun roof, a specified identification number is necessary for identifying a wiring harness having no sun roof circuit. That is, with the increase of grades of the motor vehicles, types of associated wiring harnesses increase even when the vehicles are generally of the same type. For each grade of the vehicles, each identification number is determined to manage an associated wiring harness.

As discussed with respect to FIG. 8, the prior-art on-roof wiring harness having an identification number is assembled by bundling the electrical cables with the tapes. Thus, different types of the wiring harnesses are required for different grade motor vehicles.

For example, as illustrated in FIG. 8, even for motor vehicles of the same type, one of a grade requires a rear room lamp and a sun roof, while one of another grade requires a rear room lamp but does not require a sun roof. For each grade, each identification number should be provided to manage wiring harnesses thereof.

Furthermore, the electrical cables different in purposes should be bundled by using tapes to collectively assemble them into a wiring harness. Accordingly, with an increase of grades of the motor vehicles, the types of wiring harnesses increase. For each grade of the vehicles, each identification number is determined to manage an associated wiring harness, causing a complicated management of the increased number of wiring harnesses.

Moreover, dimensional differences of motor vehicles vary positions of branches of wiring harnesses and also vary the wiring harnesses in length. Thereby, each type of the wiring harnesses requires a specified jig for securing the wiring harness when pre-assembled in a factory, since securing points vary with the lengths of the wiring harnesses. Accordingly, it is difficult to use a common jig enabling a reduced space in an assembling factory.

SUMMARY OF THE INVENTION

The present invention aims to reduce types of wiring harnesses, for example, disposed on vehicle roofs and to eliminate an accompanied complicated management of the wiring harnesses. An object of the present invention is to provide a wiring harness substantially commonly applicable to motor vehicles of various grades and types without a complicated management thereof.

For achieving the object, the present invention provides a wiring harness commonly applicable to different types of applications or commonly applicable to different grade applications of the same type. The wiring harness comprises one or more standardized circuit units incorporated into the wiring harness.

Such configured wiring harnesses remarkably reduce the types thereof in number, eliminating a complicated management of the wiring harnesses to reduce the production cost of the wiring harnesses.

More specifically, the present invention provides a wiring harness commonly applicable to different types of motor vehicles or commonly applicable to different grade motor vehicles of the same type. The wiring harness comprises at least one of a first standardized circuit unit having at least one of a dome lamp circuit and a vanity mirror lamp circuit, a second standardized circuit unit having a rear room lamp circuit, and a third standardized circuit unit having a sun roof circuit.

The wiring harness is constituted by several types of standardized pattern circuits. This remarkably reduces the type number of the wiring harnesses, eliminating a complicated management of the wiring harnesses to allow a reduced production cost of the wiring harnesses.

To assemble wiring harnesses for different types of vehicles, there are provided flexible flat circuit units, flexible printed circuit units, flat conductor circuit units, or ribbon-shaped circuit units each having electrical conductors. Such circuit units are convenient for steps of cutting, crimping, press-fitting, folding, and inspection thereof, particularly because each of the circuit units can have a standardized fold for redirecting itself at a desired position. This can provide wiring harnesses requiring no complicated management thereof, reducing a production cost of the wiring harnesses.

Preferably, the circuit unit has a fold to redirect the circuit unit.

Thus, the circuit unit can be redirected at a desired position and at a desired angle. This allows a free arrangement of the circuit unit on a roof of a motor vehicle. Furthermore, an easy and quick mounting of the circuit unit is allowed.

Preferably, the circuit unit has a connection portion at at least one end or at at least one intermediate portion of the circuit unit.

More specifically, the circuit unit has a connector at an end or at an intermediate portion of the circuit unit. The connector accommodates collectively terminals of electrical cables of the circuit unit.

Thus, the connection portion can collectively dispose electrical cables used for different purposes, enhancing an integrated pattern of the wiring harness. Particularly, the provision of the connector can surely collectively dispose the electrical cables, allowing an easy handling of the wiring harness.

Preferably, the circuit unit is defined in a flat shape. The flat-shaped circuit units are easily redirected by folding and are advantageous for temporally storing them as inventories without being bulky.

Preferably, the wiring harness is disposed on a motor vehicle roof. When the wiring harness is disposed on the motor vehicle roof, the roof may not require an extra thickness. Furthermore, the wiring harness can be easily modified in design in conformity with a structural design of the vehicle roof. Thus, the wiring harness is suitably disposed on the motor vehicle roof.

Similarly, for achieving the object, the present invention provides a manufacturing method of a wiring harness commonly applicable to different types of motor vehicles or commonly applicable to different grade motor vehicles of the same type. The method includes the steps of producing a plurality of standardized circuit units and assembling the circuit units to complete the wiring harness.

The wiring harness manufacturing method can provide a wiring harness incorporating several standardized patterns of circuits. Such configured wiring harnesses remarkably reduce the types thereof in number, eliminating a complicated management of the wiring harnesses to allow an efficient production of the wiring harnesses.

The present invention provides a more specified manufacturing method of a wiring harness commonly applicable to different types of motor vehicles or commonly applicable to different grade motor vehicles of the same type, the method comprising the steps of:

producing at least one of first to third standardized circuit units, the first standardized circuit unit having at least one of a dome lamp circuit and a vanity mirror lamp circuit, the second standardized circuit unit having a rear room lamp circuit, the third standardized circuit unit having a sun roof circuit, and assembling the circuit units into the wiring harness.

The wiring harness manufacturing method can provide a wiring harness assembled to include several standardized pattern circuits for the same type vehicles. Such configured wiring harnesses remarkably reduce the types thereof in number, eliminating a complicated management of the wiring harnesses to allow an efficient production of the wiring harnesses.

Furthermore, to assemble wiring harnesses for different types of vehicles, there are provided flexible flat circuit units, flexible printed circuit units, flat conductor circuit units, or ribbon-shaped circuit units each having electrical conductors. Such circuit units are convenient for steps of cutting, crimping, press-fitting, folding, and inspection thereof, particularly because each of the circuit units can have a standardized fold for redirecting itself. This eliminates otherwise required preparation steps, allowing an efficient production of the wiring harness.

Preferably, the circuit unit has a fold to redirect the circuit unit.

Thus, the manufacturing method can easily redirect the electrical cables. This allows a quick production of the wiring harness.

DETAILED DESCRIPTION OF THE PREFERRED EMBODIMENTS

Figure 1A:
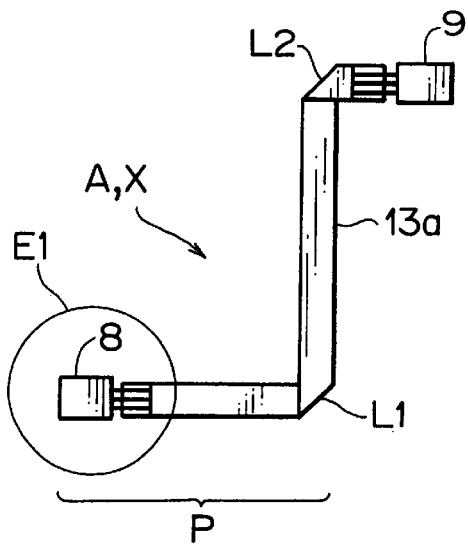
FIG. 1A is a plan view showing a circuit A for a dome lamp.

Referring to FIGS. 1 and 7, embodiments of a wiring harness and manufacturing methods thereof according to the present invention will be discussed hereinafter. The wiring harness is mounted on a motor vehicle roof, and the wiring harness uses flexible flat circuit units as electrical cables. Note that the wiring harness mounted on the motor vehicle roof may use flexible printed circuit units, flat conductor circuit units, or ribbon-shaped circuit units each having electrical conductors. In such cases, the wiring harness is similar to those discussed with respect to FIGS. 1 to 7.

The same element as one described in the prior art has the same reference numeral as that of the prior-art one. The construction of the element will not be discussed again in detail.

Figure 1B:
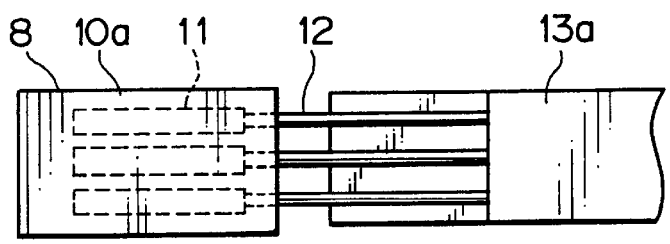
FIG. 1B is an enlarged view of a portion E1 (an area around a connector 8) of FIG. 1A.

Next, a standardized circuit will be discussed. FIG. 1A shows an example of a standardized circuit A (or a first circuit unit X) for a dome lamp. The circuit A has electrical cables (conductors), an end connector 8 for connection with other cables or electrical instruments, and an end connector 9 for the dome lamp. An end portion of the electrical cables is disposed at a position P around a vehicle pillar, and another end portion is disposed to be connected to the dome lamp. FIG. 1B is an enlarged view showing an area E1 around the connector 8. The connector 8 has a housing 10a accommodating a plurality of terminals 11 such as a press-fit terminal or a crimp terminal. The terminals are connected to associated conductors 12 each having a protective insulating sheath 13a.

In FIG. 1A, the electrical cables are redirected at a generally right angle at locations L1 and L2. Such redirection locations of the electrical cables can be desirably arranged to correspond with the size of the vehicle, and the folds can be desirably selected in number and angle thereof.

Such configuration of the electrical cables is advantageous in an assembling cost of the electrical cables. Preferably, a wiring harness having such configured cables is appropriately applied to basic grade motor vehicles.

Figure 5:
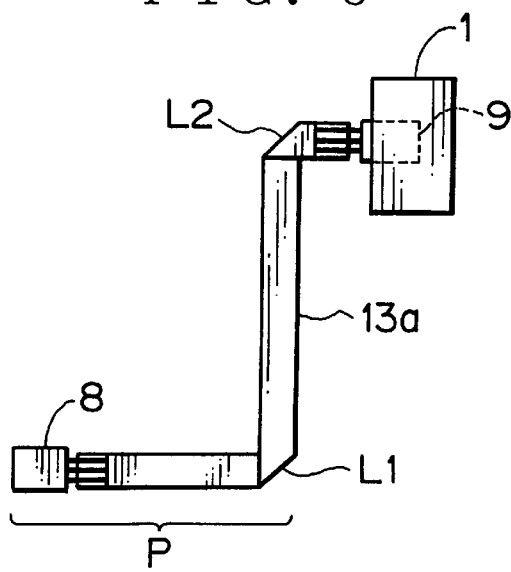
FIG. 5 is a plan view showing the circuit A for the dome lamp of FIG. 1A, and the dome lamp circuit is mounted on basic grade motor vehicles.

FIG. 5 shows a circuit applied to basic grade motor vehicles. The circuit has a flat circuit unit having electrical cables. At an end portion of the cables, there is provided a connector 9 which is connected to a dome lamp 1.

Figure 2A:
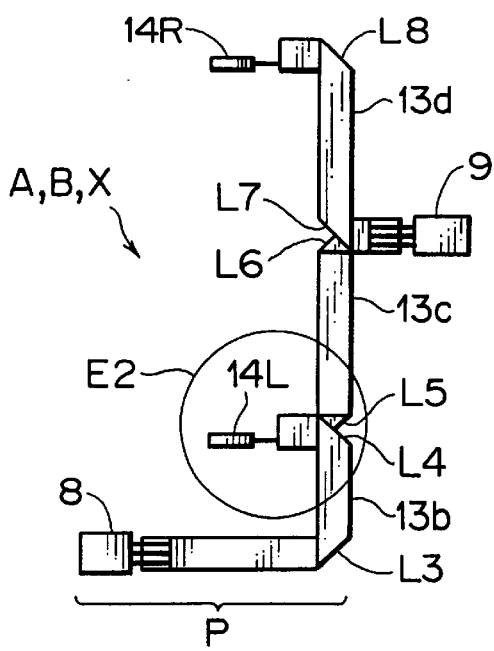
FIG. 2A is a plan view showing a circuit A for a dome lamp and a circuit B for a vanity mirror lamp.

FIG. 2A shows a circuit unit (a first circuit unit X) having a standardized circuit A for a dome lamp and a standardized circuit B for a vanity mirror lamp. The vanity mirror is generally mounted on a sun visor for a driver or a passenger. The vanity mirror has a lamp for illumination thereof.

In FIG. 2A, in addition to electrical cables for the dome lamp, there are disposed electrical cables for a right-side vanity mirror lamp and a left-side vanity mirror lamp. A connector 8 connected to other electrical cables or electrical equipment is provided at a position P around a pillar of an associated motor vehicle. Furthermore, a connector 9 for the dome lamp is provided in another side of the wiring harness.

Furthermore, connectors 14L, 14R are disposed each to be connected to the left-side or right-side vanity mirror lamp.

In this example, the dome lamp connector 9 has a shape different from the vanity mirror lamp connectors 14L, 14R for distinction thereof as illustrated in FIG. 2A. This is advantageous for preventing a wrong wiring of the dome lamp and the left/right room lamps.

The electrical cables constituting the flat circuit unit are redirected at a generally right angle at a location L3 around a pillar of an associated motor vehicle. Furthermore, the electrical cables are redirected generally at a right angle at a location L4 in an area near the connector 14L of the left-side vanity mirror lamp.

Figure 2B:
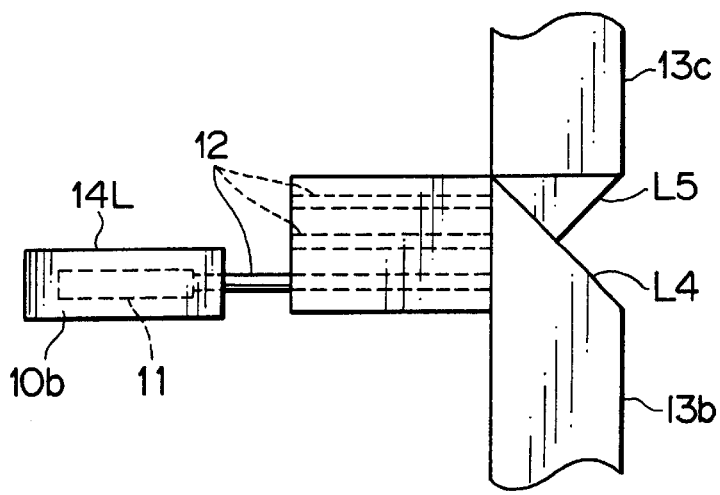
FIG. 2B is an enlarged view of a portion E2 (an area around a connector 14L of the vanity mirror lamp)

FIG. 2B shows an enlarged view of an area E2 around the connector 14L of the vanity mirror lamp of FIG. 2A. As illustrated in FIG. 2B, the connector 14L has a housing 10b accommodating terminals 11 such as a press-fit terminal or a crimp terminal. The terminals 11 are electrically connected to associated conductors 12. To electrically connect one of conductors 12 protected by an insulating sheath 13b to one of conductors 12 protected by an insulating sheath 13c, a part of each of the insulating sheathes 13b and 13c is removed, so that the striped conductor portions are connected, for example, by a welding means.

Some electrical cables lead from the welded part and are redirected at a generally right angle at a location L5 near the connector 14L of the left-side vanity mirror lamp toward the connector 9 of the dome lamp. The electrical cables are also redirected at a generally right angle at a location L6 for connection to the connector 9 of the dome lamp.

Furthermore, some electrical cables lead from the dome lamp connector 9 and are redirected at a generally right angle at a location L7 near the connector 9. The electrical cables are redirected at a generally right angle at a location L8 near the connector 14R of the right-side vanity mirror lamp to be connected to the connector 14R.

As described above, a circuit unit is defined by conductors (electrical cables) protected in the insulating sheath 13c, conductors (electrical cables) protected by the insulating sheath 13d, and the dome lamp connector 9 accommodating terminals of the electrical cables.

In FIG. 2A, the electrical cables have six right angle folds. The number of the folds may be desirably modified, and the folds may be provided at a desired location to correspond with the size of the associated vehicle. The fold angle may be desirably determined.

Thus compactly arranged electrical cables provide a wiring harness having the connector 14L of the left-side vanity mirror lamp, the connector 14R of the right-side vanity mirror lamp, and the dome lamp connector 9. The wiring harness can be easily installed with a less cost but are applied to high grade motor vehicles.

Figure 3:
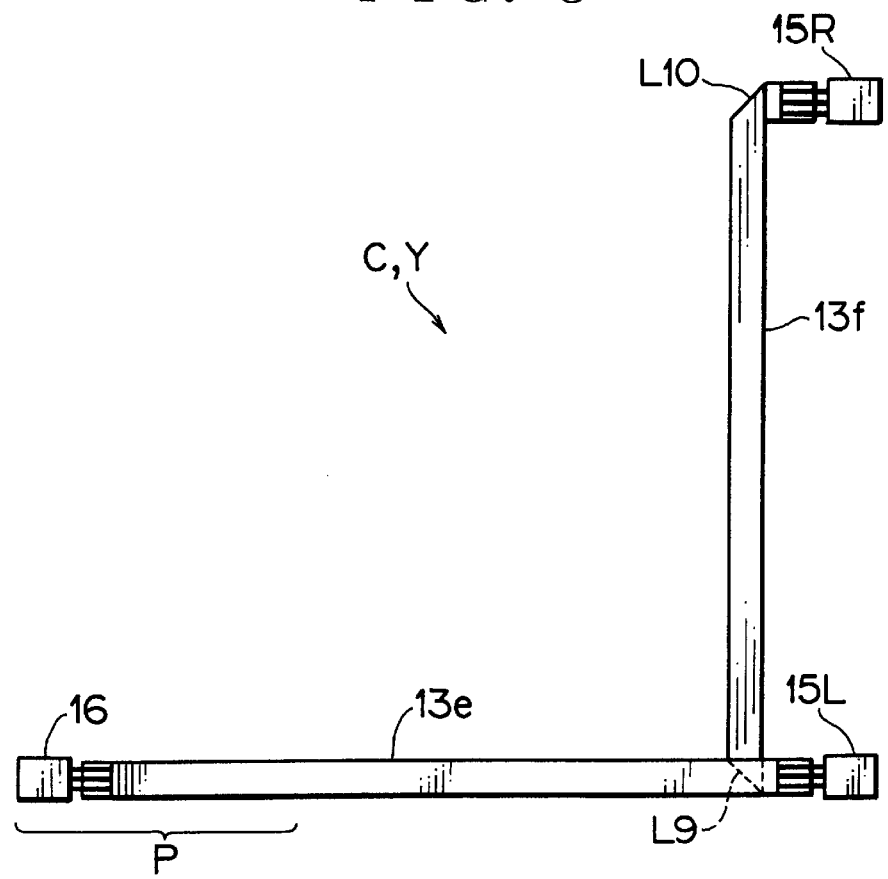
FIG. 3 is a plan view showing a circuit C for a rear room lamp.

FIG. 3 shows a second circuit unit Y having a standardized circuit C for a rear room lamp. The circuit unit is an example of an electrical cable circuit for electrical connection of a left-side rear room lamp and a right-side rear room lamp of a motor vehicle.

The circuit has a connector 15L for the left-side rear room lamp and a connector 15R for the right-side rear room lamp for connection with associated electrical cables. The electrical cables are connected to an end connector 16 at a position P around a vehicle pillar, and the connector 16 is used for connection with other cables. At other two ends, the electrical cables can be connected respectively to the right-side or left-side rear room lamp through the connector 15R or 15L.

First, the electrical cables of the circuit linearly lead from the position P around the pillar to the connector 15L of the left-side rear room lamp. Next, the electrical cables are redirected at a location L9 near the connector 15L at a generally right angle to lead to the right-side rear room lamp. Furthermore, the electrical cables are redirected at a generally right angle at a location L10 near the connector 15R for the right-side rear room lamp.

A circuit unit is defined by conductors (electrical cables) protected in an insulating sheath 13e, conductors (electrical cables) protected by an insulating sheath 13d, and the connector 15L accommodating terminals for the electrical cables. The connector 15 also allows electrical connection between the conductors in the insulating sheathes 13e and 13f.

Thus compact configured electrical cables are advantageous for an easy assembling thereof. As previously described, the folds may be provided at desired locations to correspond with the size of an associated vehicle. The fold angle may be desirably determined.

Figure 6A:
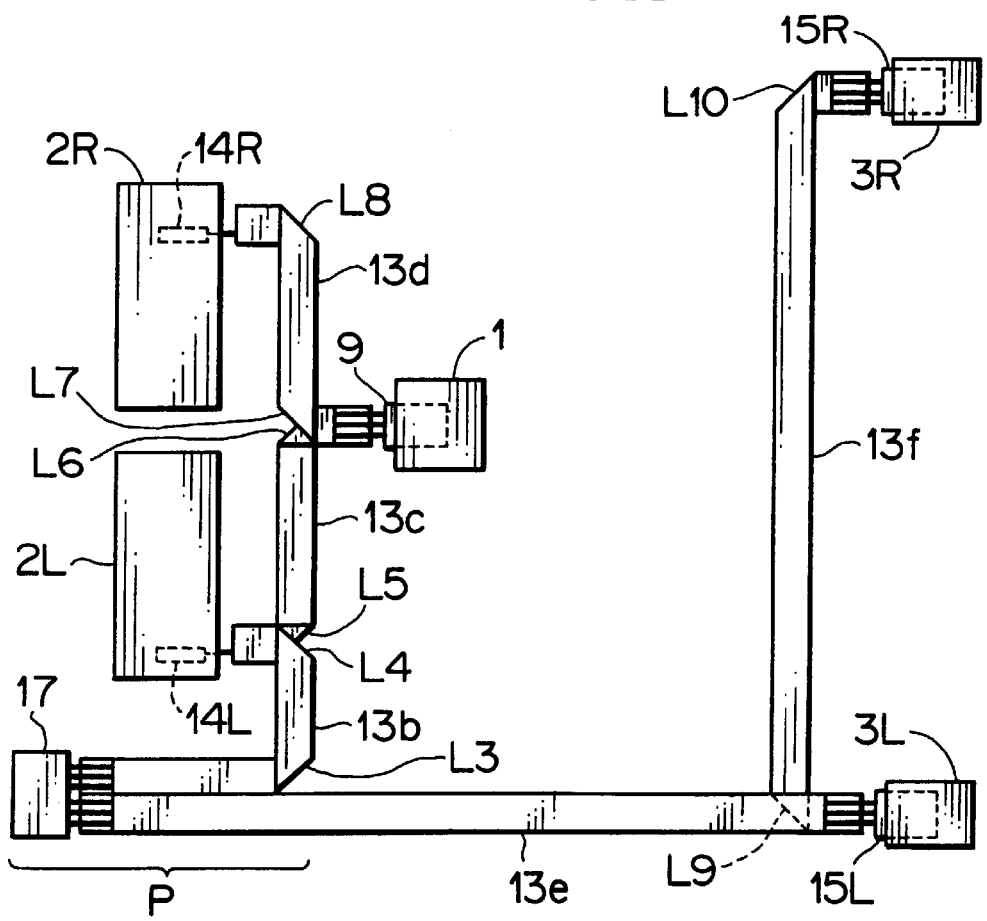
FIGS. 6A and 6B each are a plan view showing a circuit for a high grade motor vehicle, and the circuit has the dome lamp circuit A of FIG. 2A, the vanity mirror lamp circuit B of FIG. 2A, and the rear room lamp circuit C of FIG. 3.
Figure 6B:
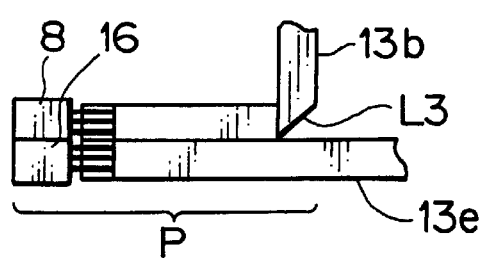

This circuit unit is mainly applied to a high grade circuit. As illustrated in FIG. 6A, the circuit unit (first circuit unit X) consisting of the dome lamp circuit A and the vanity mirror lamp circuit B of FIG. 2A is combined with the rear room lamp circuit (second circuit unit Y) of FIG. 3. As illustrated in FIG. 6A, the electrical cables for different purposes are collectively received in a connector 17 located at a position around a vehicle pillar. Alternatively, as illustrated in FIG. 6B, the connectors 8 and 16 may be parallel disposed adjacent to each other. The circuit unit may be constituted by a flexible flat circuit unit, a flexible printed circuit unit, a flat conductor circuit unit, or a ribbon-shaped circuit unit having round electrical wires. A plurality of the circuit units maybe combined with one another by using roughly bundling tapes to complete a wiring harness mounted on a vehicle roof.

In the prior art, a number of different types of wiring harnesses with identification numbers have been provided. Meanwhile, in the embodiment, the standardized circuit of FIG. 2A is combined with the standardized circuit of FIG. 3. The electrical cables for different purposes are collectively received in a connector located at a position around a vehicle pillar. The standardized circuit unit may be constituted by a flexible flat circuit unit, a flexible printed circuit unit, a flat conductor circuit unit, or a ribbon-shaped circuit unit having round electrical wires. A plurality of the circuit units are combined with one another by using roughly bundling tapes to complete a wiring harness mounted on a vehicle roof. This provides the wiring harness with no complicated management thereof.

Figure 4:
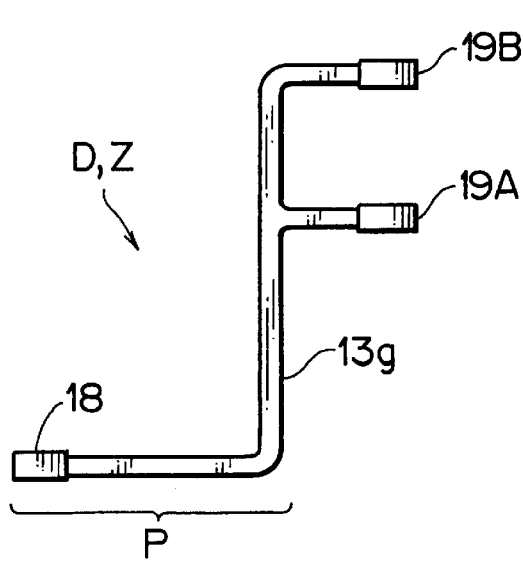
FIG. 4 is a plan view of a circuit D for a sun roof.

FIG. 4 shows a standardized circuit C (third circuit unit Z) for a sun roof. The circuit is applied to further high grade motor vehicles. As illustrated in FIG. 4, the circuit C has a branch at a predetermined location and the branch has electrical cables for a switch of the sun roof.

The circuit C has a connector 18 disposed at a position P around a vehicle pillar. Conductors (electrical cables) protected by an insulating sheath 13g lead from the connector 18 to a connector 19A connected to the switch of the sun roof and to a connector 19B connected to an electric control unit for the sun roof.

In FIG. 4, the circuit has two generally right angle folds and a branch. The circuit of FIG. 4 may be another circuit differently arranged. As previously described, the folds may be provided at a desired location to correspond with the size of an associated vehicle. The fold angle may be desirably determined.

Figure 7B:
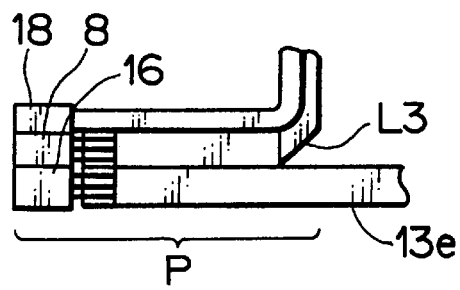
FIGS. 7A and 7B each are a plan view of a circuit of a high grade motor vehicle having a sun roof, and the circuit has collectively the dome lamp circuit A of FIG. 2A, the vanity mirror lamp circuit B of FIG. 2A, the rear room lamp circuit C of FIG. 3, and the sun roof circuit D of FIG. 4.
Figure 7A:
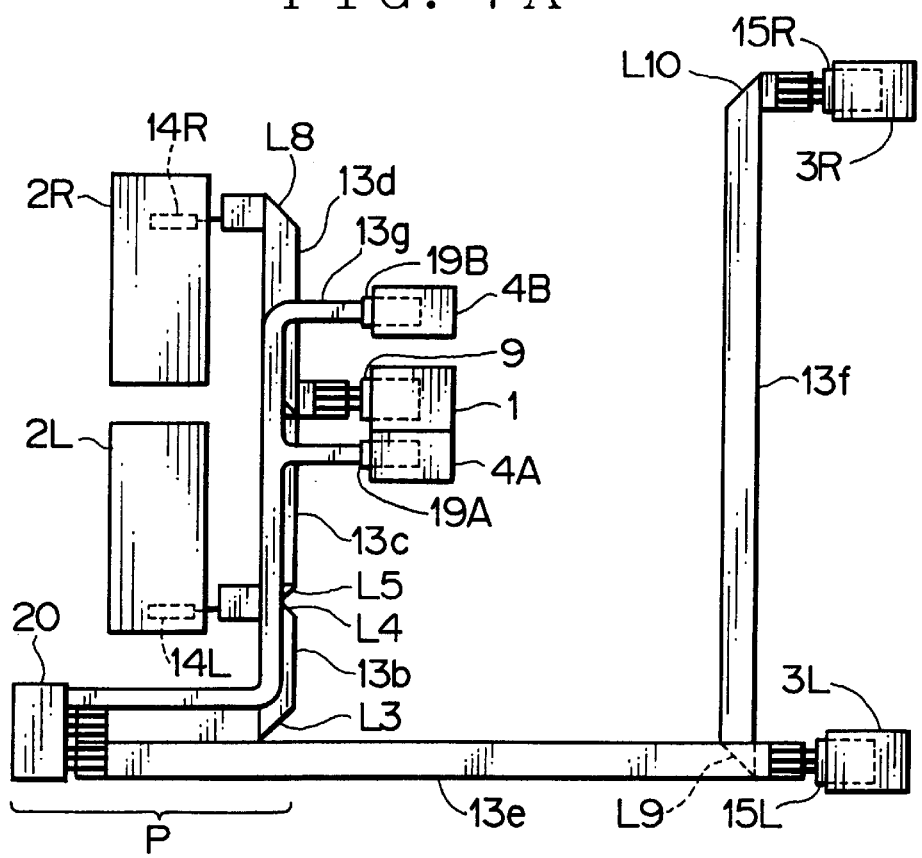

The sun roof circuit is mainly added to a high grade circuit of a motor vehicle. As illustrated in FIG. 7A, the combination of the standardized circuits of FIGS. 2A, 3, and 4 defines a circuit unit for a wiring harness disposed on a motor vehicle roof. The electrical cables for different purposes are collectively received in a connector 20 located at a position P around a vehicle pillar. The circuit unit may be constituted by a flexible flat circuit unit, a flexible printed circuit unit, a flat conductor circuit unit, or a ribbon-shaped circuit unit having round electrical wires. A plurality of the circuit units maybe combined with one another by using roughly bundling tapes to complete the wiring harness. Alternatively, as illustrated in FIG. 7B, different connectors 8, 16, and 18 may be combined with one another to collect the circuit units.

Figure 8:
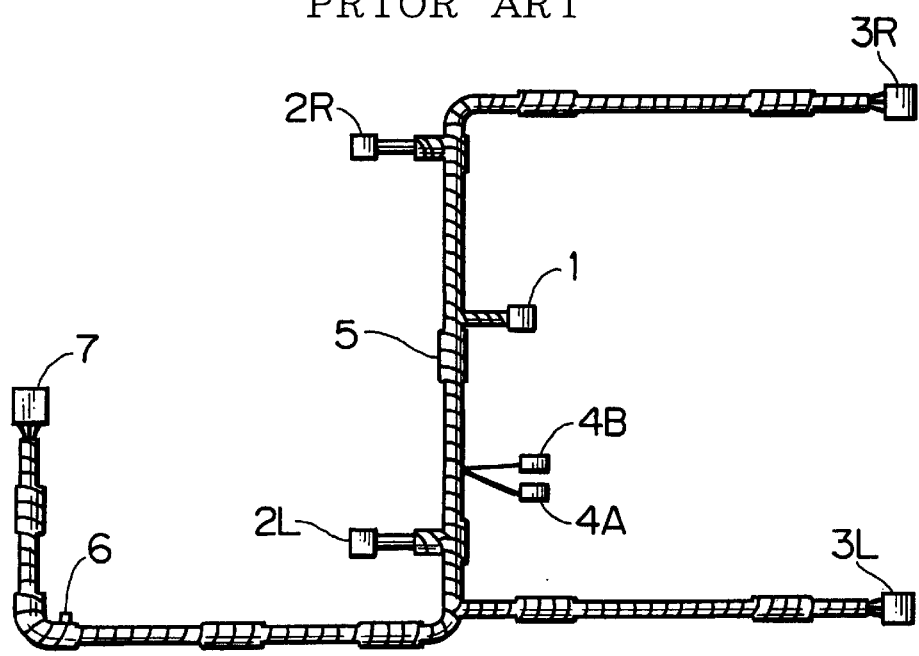
FIG. 8 is a plan view showing a prior-art wiring harness of a specified, grade vehicle of a specified-type.

In the prior art, a number of different types of wiring harnesses have been provided with identification numbers as discussed of FIG. 8. Meanwhile, in the embodiment illustrated in FIG. 7, the combination of the standardized circuits of FIGS. 2A, 3, and 4 defines a circuit unit for a wiring harness disposed on a motor vehicle roof. The electrical cables different in purposes are collectively received in a connector 20 located at a position P around a vehicle pillar. The circuit unit may be constituted by a flexible flat circuit unit, a flexible printed circuit unit, a flat conductor circuit unit, or a ribbon-shaped circuit unit having round electrical wires. The standardized circuit of FIG. 2A is combined with the standardized circuit of FIG. 3. The electrical cables for different purposes are collectively received in a connector located at a position around the vehicle pillar. A plurality of the circuit units may be combined with one another by using roughly bundling tapes to complete a wiring harness mounted on a vehicle roof. This provides a wiring harness disposed on a roof of a motor vehicle with no complicated management thereof.

As illustrated in FIG. 6 or 7, the present invention provides a wiring harness commonly applicable to different types of motor vehicles or commonly applicable to the same type of motor vehicles but having different grades. The wiring harness comprises at least two of a first standardized circuit unit X having at least one of a dome lamp circuit A and a vanity mirror lamp circuit B, a second standardized circuit unit Y having a rear room lamp circuit C, and a third standardized circuit unit Z having a sun roof circuit D. Each circuit unit may be constituted by a flexible flat circuit unit, a flexible printed circuit unit, a flat conductor circuit unit, or a ribbon-shaped circuit unit having round electrical wires. Particularly, the wiring harness is advantageously mounted in a roof of a motor vehicle.

As illustrated in FIG. 6 or 7, the present invention also provides a specified manufacturing method of a wiring harness commonly applicable to different types of motor vehicles or commonly applicable to the same type of motor vehicles but different in grade. The method comprises the steps of:

producing at least two of first to third standardized circuit units, the first standardized circuit unit X having at least one of a dome lamp circuit A and a vanity mirror lamp circuit B, the second standardized circuit unit Y having a rear room lamp circuit C, the third standardized circuit unit Z having a sun roof circuit D, and combining the two circuit units to complete the circuit unit.

The standardized circuit unit has generally has a connector at each end portion of the electrical cables according to the present invention as illustrated in FIGS. 1A, 2A, 3, and 4. Alternatively, the standardized circuit unit may not have a connector but may have a terminal at each end portion of the electrical cables.

For example, referring to FIG. 7A, the standardized circuits, which are the dome lamp circuit A, the vanity mirror lamp circuit B, the rear room lamp circuit C, and the sun roof circuit D, are prepared. Each of the standardized circuits does not have a connector 8, 16, or 18 but has a terminal at a position P around a vehicle pillar. Next, as illustrated in FIG. 7A, the standardized circuits different in purposes are collectively disposed at the position P around the pillar, and the terminals are received in a housing of a connector 20. Thus, the connector 20 allows to bundle the circuits different in purposes to provide a wiring harness mounted on a motor vehicle roof.

That is, the standardized circuits according to the present invention are ready for any incorporation or combination thereof to constitute a wiring harness. The standardized circuits may be different in the purposes. More specifically, a plurality of standardized circuits are prepared for assembling wiring harnesses required for motor vehicles of plural types and grades.

In the aforementioned embodiment, the wiring harness including the dome lamp circuit A, the vanity mirror lamp circuit B, the rear room lamp circuit C, and the sun roof circuit D has been discussed. However, the present invention is not limited in the wiring harness but also may be applied to a wiring harness for any other electrical equipment of a motor vehicle.

For example, within the sprit of the present invention, the present invention is not limited in a wiring harness disposed on a motor vehicle roof but also may be applied to a circuit mounted on a door or mounted around a front instrument panel of a motor vehicle. Furthermore, the present invention may be applied to a wiring harness for electrical equipment other than a motor vehicle.

Note that the position P around the pillar is more definitely a position near a base of the pillar or near a cross point of the pillar and the roof of the motor vehicle.

The electrical cables illustrated in FIGS. 1 to 7 lead from a left or right forward end of the motor vehicle roof, more specifically from the position P around the pillar to a middle or a rear end of the roof.

Since a power source of the motor vehicle is received generally in an engine room located in a forward side of the vehicle, the electrical cables of the roof wiring harness are arranged to lead from a fore roof part around the pillar to electrical instruments mounted on the roof. This minimizes the cables in length.

Each end of the electrical cable is provided with a press-fit terminal, a crimp terminal, a connector housing, or a male/female busbar. Alternatively, the electrical cable may have a sheath stripped end. Preferably, the electrical cable has an end fitted with a press-fit terminal.

Since the press-fit terminal can be reliably quickly secured to the electrical cable, a circuit for a motor vehicle roof wiring harness can be efficiently assembled. The wiring harness may be constituted by a flexible flat circuit unit, a flexible printed circuit unit, a flat conductor circuit unit, or a ribbon-shaped circuit unit having round electrical wires.

Preferably, the electrical cable used in the present invention has a thin, generally flat shape and is flexible to be easily folded. The electrical cables may constitute a flexible flat circuit unit, a flexible printed circuit unit, a flat conductor circuit unit, or a ribbon-shaped circuit unit having round electrical wires.

Advantageously, such electrical cables are easily folded to be redirected in a desirable direction and can be received in a thin narrow space of a motor vehicle roof to make a maximum use of a limited vehicle space.

The wiring harness according to the present invention can be used to various applications and locations. For example, the wiring harness can be mounted on motor vehicles of various types and grades.

More specifically, the present invention is applied to a wiring harness having at least one standardized circuit of the dome lamp circuit, the vanity mirror lamp circuit, the rear room lamp circuit, and the sun roof circuit.

The manufacturing method according to the present invention allows simplified production equipment and simplified production steps, enabling a saving in labor.

More specifically, the manufacturing method can complete a wiring harness having at least one standardized circuit of the dome lamp circuit, the vanity mirror lamp the circuit, the rear room lamp circuit, and the sun roof circuit.

What is claimed is:

1. A manufacturing method of a wiring harness applicable to a motor vehicle comprising the steps of:

(a) producing a plurality of flexible flat circuits each having a connector at each end thereof, (b) defining a plurality of standardized circuit units by folding each of the flexible flat circuits to obtain a desired circuit pattern, and (c) incorporating the standardized circuit units to complete the wiring harness, wherein said step (b) includes defining a connection branch at an intermediate portion of at least one of the circuit units, the connection branch being defined by folding the flexible flat circuit such that the flexible flat circuit leads to the connection branch through a fold and leaves the connection branch through another fold.

2. The manufacturing method set forth in claim 1, wherein the wiring harness can be disposed on a roof of the motor vehicle.

* * * * *